United States Patent
Al-Ajmi et al.

(10) Patent No.: US 10,459,118 B2
(45) Date of Patent: *Oct. 29, 2019

(54) METHODS AND SYSTEMS FOR ESTIMATING SIZES AND EFFECTS OF WELLBORE OBSTRUCTIONS IN WATER INJECTION WELLS

(71) Applicant: Saudi Arabian Oil Company, Dhahran (SA)

(72) Inventors: Mohammed Dhafer Al-Ajmi, Al Khobar (SA); Sami Abdulaziz Alnuaim, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 112 days.

This patent is subject to a terminal disclaimer.

(21) Appl. No.: 15/706,084

(22) Filed: Sep. 15, 2017

(65) Prior Publication Data

US 2018/0003858 A1 Jan. 4, 2018

Related U.S. Application Data

(63) Continuation of application No. 14/317,759, filed on Jun. 27, 2014, now Pat. No. 9,784,885.

(51) Int. Cl.
| | | |
|---|---|---|
| *G06G 7/48* | (2006.01) | |
| *G01V 99/00* | (2009.01) | |
| *G06F 17/10* | (2006.01) | |
| *G06F 17/50* | (2006.01) | |
| *E21B 47/09* | (2012.01) | |
| *E21B 49/00* | (2006.01) | |

(52) U.S. Cl.
CPC ............ *G01V 99/005* (2013.01); *E21B 47/09* (2013.01); *E21B 49/008* (2013.01); *G06F 17/10* (2013.01); *G06F 17/5009* (2013.01)

(58) Field of Classification Search
CPC .................................................... G01V 99/005
USPC .......................................................... 703/10
See application file for complete search history.

(56) References Cited

U.S. PATENT DOCUMENTS

| | | | |
|---|---|---|---|
| 7,451,812 B2 | 11/2008 | Cooper et al. | |
| 7,953,587 B2 | 5/2011 | Bratton et al. | |
| 8,078,328 B2 | 12/2011 | Malki et al. | |
| 8,131,470 B2 | 3/2012 | Yusti et al. | |
| 8,670,966 B2 | 3/2014 | Rashid et al. | |
| 9,784,885 B2* | 10/2017 | Al-Ajmi | G01V 99/005 |

(Continued)

FOREIGN PATENT DOCUMENTS

| | | |
|---|---|---|
| WO | 2013059971 A1 | 5/2013 |
| WO | 2013085479 A1 | 6/2013 |

OTHER PUBLICATIONS

Crabtree et al., "Fighting Scale—Removal and Prevention", Oilfield Review, 1999, pp. 30-45.

(Continued)

*Primary Examiner* — Hugh M Jones
(74) *Attorney, Agent, or Firm* — Bracewell LLP; Constance G. Rhebergen; LaTasha M. Snipes

(57) ABSTRACT

Methods and systems to estimate physical dimensions of actual obstructions identified as being in a wellbore of an injection well are provided. Methods and systems include the determination of a well performance model with a simulated obstruction, using inflow performance and outflow performance relationships.

20 Claims, 9 Drawing Sheets

(56) References Cited

U.S. PATENT DOCUMENTS

| | | |
|---|---|---|
| 2011/0067882 A1 | 3/2011 | Yeriazarian et al. |
| 2011/0320047 A1 | 12/2011 | Stone et al. |
| 2013/0035919 A1 | 2/2013 | Al-Shammari et al. |
| 2013/0035920 A1 | 2/2013 | Al-Shammari et al. |
| 2013/0116998 A1 | 5/2013 | Shirzadi et al. |
| 2013/0297273 A1 | 11/2013 | Altundas et al. |
| 2014/0025303 A1 | 1/2014 | Alshawaf et al. |

OTHER PUBLICATIONS

Quinao et al., "Correlation of Reservoir Monitoring and Continuous Production Data To Interpret Unexpected Well Behavior in Rotokawa", New Zealand Geothermal Workshop Proceedings, 2012, pp. 1-5.

\* cited by examiner

METHODS AND SYSTEMS FOR ESTIMATING SIZES AND EFFECTS OF WELLBORE OBSTRUCTIONS IN WATER INJECTION WELLS

CROSS REFERENCE TO RELATED APPLICATION

This application is a continuation of co-pending U.S. application Ser. No. 14/317,759 filed on Jun. 27, 2014, the disclosure of which is hereby incorporated herein by reference.

FIELD OF INVENTION

The present invention relates generally to the oil industry, particularly reservoir engineering, and more particularly to systems, program product, and methods for detecting the presence of obstructions in the wellbores of injection wells and for evaluating the dimensions of the obstructions and their effects on the performance of the injection wells.

BACKGROUND

Efficient and productive recovery of oil and natural gas from underground deposits involves several complex technologies. For example, primary recovery relies on underground pressure, which can originate from several sources including an underlying water layer below the oil layer or a gas cap formed of gas collected immediately above the oil layer. Whether or not such underground pressure initially existed, once reservoir pressure has either been depleted or is otherwise below a minimum value, oil must be brought to the surface using secondary methodologies. One such secondary methodology includes injecting water below the oil layer. Another methodology includes injecting a gas above the oil layer. Other methodologies of extracting oil, particularly when underground pressure has been depleted to a point where the reservoir cannot be sufficiently pressurized, include reducing the viscosity through the injection of heat, vapor, surfactants, solvents, or miscible gases (e.g., carbon dioxide).

Water is a particularly useful tool because it can be used to pressurize a virgin or depleted reservoir (both naturally and through injection), but can also be used to proactively maintain reservoir pressure and/or to direct oil in a reservoir toward an existing oil well. While production wells can be converted into injection wells, water-injection wells are also drilled specifically for the purpose of enhanced oil recovery. Water is then pumped into the reservoir, or gravity can help to push the liquid into the formation. Performance of water injection wells is monitored to ensure desired operation of the oil recovery process. When an obstruction forms in the wellbore, effective detection and estimation techniques are needed to characterize and remove such obstruction. Obstructions usually result from deposits in the wellbore, for example, scale paraffin, asphaltenes, salt, solids or corrosion products. Obstructions can also result from debris or particles in the injected fluid. Obstructions can also result from build-up of fines and scale in the wellbore. Obstructions can also result from mechanical downhole fish issues such as those resulting from items left in a wellbore, including, but not limited to, pieces of various drilling, logging, or production equipment. Deformations in the tubing or casing of the wellbore can also cause obstructions. These obstructions can be removed or reduced by one or more of chemical and mechanical technologies, depending on several factors including location of the obstruction and its properties. A chemical technology often used in treating obstructions involves acid treatments. Various acids, such as sulfuric acid and hydrochloric acid, have been injected into the wellbore in order to remove blocking material and to increase the productivity of injection wells. Obstructions can also be removed or decreased in size by mechanical milling using coiled tubing or wireline or other specialized apparatuses.

SUMMARY OF THE INVENTION

The Applicants recognize the importance of detecting a presence of at least one obstruction in a wellbore of an injection well and determining dimensions of that obstruction. Various embodiments of methods and apparatus for detecting a presence of at least one obstruction in a wellbore of an injection well and determining dimensions of that obstruction are provided herein. Exemplary embodiments of the invention include a method of detecting a presence of at least one obstruction in a wellbore of an injection well and determining dimensions of that obstruction. An embodiment of the invention includes a method to estimate one or more physical dimensions of one or more actual obstructions identified as being in a wellbore of an injection well. This method includes the steps of: (a) estimating one or more locations within the wellbore and one or more physical dimensions of one or more actual obstructions to thereby define a simulated obstruction within the wellbore; (b) obtaining two or more sets of actual measurements of two or more characteristics of fluid flow in the wellbore, including two or more actual injection rates and two or more actual injection pressures; (c) calculating a plurality of actual upstream pressure values of the simulated obstruction, the upstream pressure values being responsive to a first outflow performance relationship and a first set of actual measurements of two or more characteristics of fluid flow in the wellbore, the first set of measurements including a first set of actual fluid injection rates and a first set of actual injection pressures; (d) calculating a plurality of corresponding downstream pressure values across the simulated obstruction, the corresponding downstream pressure values being responsive to a first estimated injectivity index value, one or more actual measurements of one or more characteristics of the reservoir associated with the injection well, and the first set of actual measurements of two or more characteristics of fluid flow in the wellbore; (e) determining one or more functions to associate a plurality of pressure differentials between the upstream pressure values and the corresponding downstream pressure values with the first set of actual fluid injection rates responsive to a function of estimated downhole choke behavior for the wellbore to thereby model the fluid flow across the simulated obstruction to thereby define the simulated obstruction model; (f) determining a second outflow performance relationship for the fluid flow through the wellbore responsive to the simulated obstruction model to thereby model well performance with the simulated obstruction; (g) determining a second estimated injectivity index value responsive to matching a second set of actual measurements of two or more characteristics of fluid flow in the wellbore with a set of simulated fluid flow values obtained from the well performance model with the simulated obstruction, the second set of actual measurements including a second set of actual fluid injection rates and a second set of actual injection pressures; (h) performing iteratively steps (b) to (g) until the first estimated injectivity index value and the second estimated injectivity index value converge within preselected tolerance limits; and (i) determining one or more physical dimensions of one or more actual obstructions in the wellbore responsive to the simulated obstruction model and a plurality of measurements of one or more characteristics associated with the wellbore when the first estimated injectivity index value and the second estimated injectivity index value converge within preselected tolerance limits.

Exemplary embodiments of the invention include a system to estimate one or more physical dimensions of one or more actual obstructions identified as being in a wellbore of an injection well. The system includes one or more processors, one or more input and output units in communication with the one or more processors and positioned to receive a user selection of a wellbore of an injection well; and one or more databases in communication with the one or more processors. The one or more databases include a plurality of actual measurements of one or more characteristics of fluid flow in the wellbore of an injection well, a plurality of actual measurements of one or more characteristics of a reservoir associated to the injection well, and a plurality of actual measurements of one or more characteristics of the wellbore of the injection well. The system also includes a non-transitory computer-readable medium positioned in communication with the one or more processors and having computer program stored thereon. The computer program includes a set of instructions that when executed by one or more processors cause the one or more processors to perform operations of: (a) estimating one or more locations within the wellbore and one or more physical dimensions of one or more actual obstructions to thereby define a simulated obstruction within the wellbore; (b) obtaining two or more sets of actual measurements of two or more characteristics of fluid flow in the wellbore including two or more actual injection rates and two or more actual injection pressures; (c) calculating a plurality of actual upstream pressure values of the simulated obstruction, the upstream pressure values being responsive to a first outflow performance relationship and a first set of actual measurements of two or more characteristics of fluid flow in the wellbore, the first set of measurements including a first set of actual fluid injection rates and a first set of actual injection pressures; (d) calculating a plurality of corresponding downstream pressure values across the simulated obstruction, the corresponding downstream pressure values being responsive to a first estimated injectivity index value, one or more actual measurements of one or more characteristics of the reservoir associated with the injection well, and the first set of actual measurements of two or more characteristics of fluid flow in the wellbore; (e) determining one or more functions to associate a plurality of pressure differentials between the upstream pressure values and the corresponding downstream pressure values with the first set of actual fluid injection rates responsive to a function of estimated downhole choke behavior for the wellbore to thereby model the fluid flow across the simulated obstruction to thereby define the simulated obstruction model; (f) determining a second outflow performance relationship for the fluid flow through the wellbore responsive to the simulated obstruction model to thereby model well performance with the simulated obstruction; (g) determining a second estimated injectivity index value responsive to matching a second set of actual measurements of two or more characteristics of fluid flow in the wellbore with a set of simulated fluid flow values obtained from the well performance model with the simulated obstruction, the second set of actual measurements including a second set of actual fluid injection rates and a second set of actual injection pressures; (h) performing iteratively steps (b) to (g) until the first estimated injectivity index value and the second estimated injectivity index value converge within preselected tolerance limits; and (i) determining one or more physical dimensions of one or more actual obstructions in the wellbore responsive to the simulated obstruction model and a plurality of measurements of one or more characteristics associated with the wellbore when the first estimated injectivity index value and the second estimated injectivity index value converge within preselected tolerance limits.

Exemplary embodiments of the invention include a computer-implemented method to determine dimensions of one or more actual obstructions identified as being in a wellbore of an injection well. The method includes (a) obtaining a plurality of measurements of one or more characteristics of fluid flow in a wellbore of an injection well, a plurality of measurements of one or more characteristics of a reservoir associated with the injection well, and a plurality of measurements of one or more characteristics associated with the wellbore of the injection well; (b) creating one or more correlations based on a first estimated injectivity index to simulate fluid flow across one or more simulated mechanical obstructions to thereby define a simulated obstruction performance model, the one or more correlations being responsive to the plurality of measurements of one or more characteristics of fluid flow in the wellbore of the injection well, the plurality of measurements of one or more characteristics of the reservoir associated with the injection well, the plurality of measurements of one or more characteristics associated with the wellbore of the injection well, and a plurality of simulated fluid flow measurements across the at least one simulated mechanical obstruction in the wellbore; (c) determining a second estimated injectivity index, responsive to the simulated obstruction performance model, the plurality of measurements of one or more characteristics of actual fluid flow in the wellbore of the injection well, the plurality of measurements of one or more characteristics of the reservoir associated with the injection well, and the plurality of measurements of one or more characteristics associated with the wellbore of the injection well; (d) performing iteratively steps (a) to (c) until the first estimated injectivity index value and the second estimated injectivity index value converge within preselected tolerance limits; and (e) determining dimensions of the one or more actual obstruction in the wellbore responsive to the simulated obstruction performance model and the plurality of measurements of one or more characteristics associated with the wellbore of the injection well when the first estimated injectivity index and the second estimated injectivity index converge within acceptable tolerance limits.

In certain embodiments of the invention, the simulated obstruction performance model includes at least one of the following: an outflow performance relationship analysis and an inflow performance relationship analysis. The outflow performance relationship analysis is responsive to the plurality of measurements of one or more characteristics of fluid flow in the wellbore of the injection well. The inflow performance relationship analysis is responsive to the plurality of measurements of one or more characteristics of fluid flow in the wellbore of the injection well and the plurality of measurements of one or more characteristics of the reservoir associated with the injection well.

BRIEF DESCRIPTION OF THE DRAWINGS

The application file contains at least one drawing executed in color. Copies of this patent application publication with color drawings will be provided by the Patent and Trademark Office upon request and payment of the necessary fee.

So that the manner in which the above-recited features, aspects and advantages of the invention, as well as others that will become apparent, are attained and can be understood in detail, more particular description of the invention briefly summarized above can be had by reference to the embodiments thereof that are illustrated in the drawings that form a part of this specification. It is to be noted, however, that the appended drawings illustrate some embodiments of the invention and are, therefore, not to be considered limiting of the invention's scope, for the invention can admit to other equally effective embodiments.

DETAILED DESCRIPTION

Figure 1:
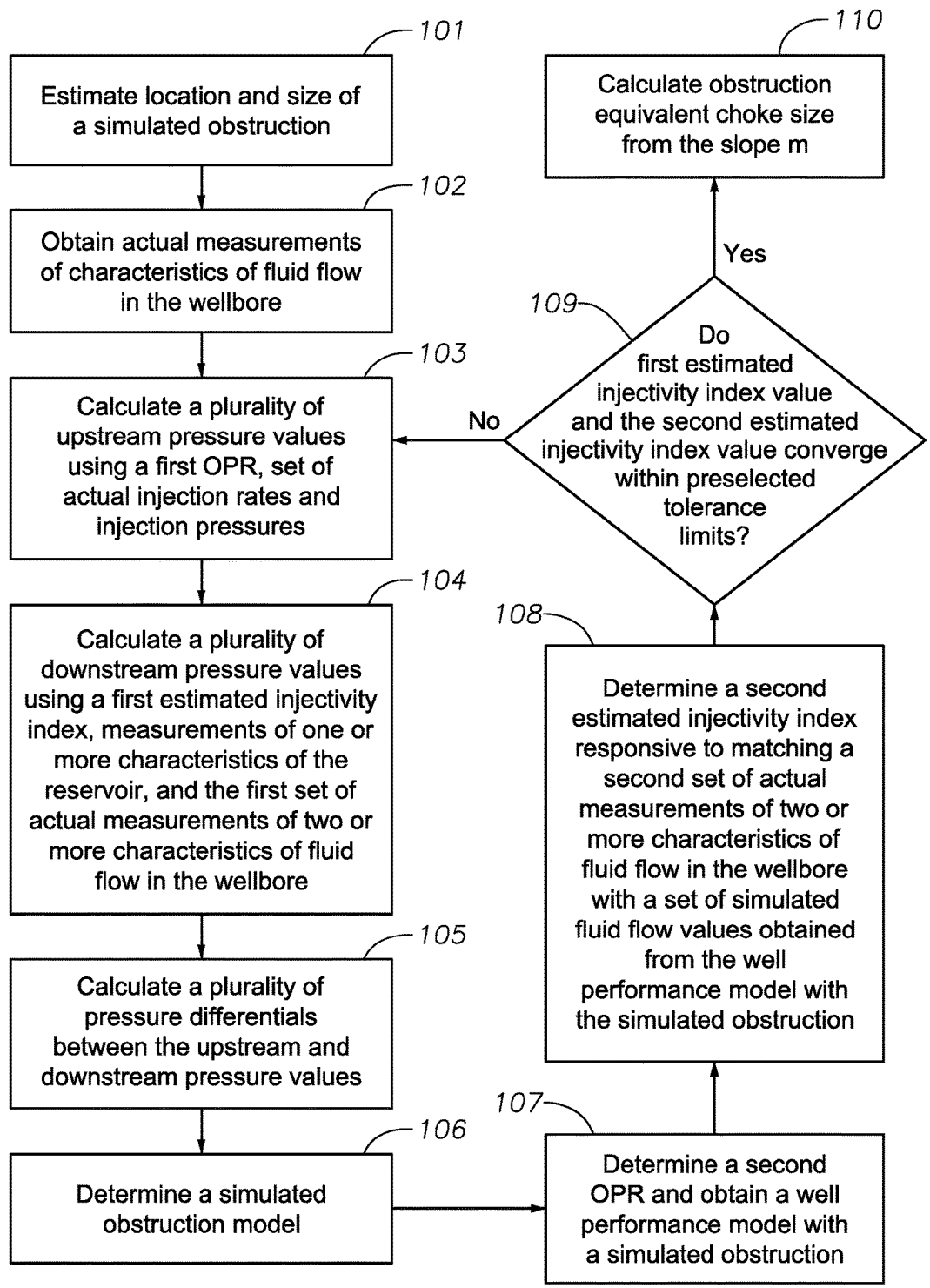
FIG. 1 is a schematic block diagram of an exemplary method to estimate one or more physical dimensions of one or more actual obstructions in a wellbore of an injection well.

The present inventions will be described more fully hereinafter with reference to the accompanying drawings in which embodiments of the invention are shown. These inventions may, however, be embodied in many different forms and should not be construed as limited to the exemplary embodiments set forth herein; rather, these embodiments are provided so that this disclosure will be thorough and complete, and will fully convey the scope of the inventions to those skilled in the art.

While these embodiments have been described with emphasis on the embodiments, it should be understood that within the scope of the appended claims, the embodiments might be practiced other than as specifically described herein. Although the invention has been shown in only a few of its forms, it should be apparent to those skilled in the art that it is not so limited but susceptible to various changes without departing from the scope of the invention. Accordingly, it is intended to embrace all such alternatives, modifications, and variations as fall within the spirit and broad scope of the appended claims.

It is to be fully recognized that the different teachings of the various embodiments discussed below may be employed separately or in any suitable combination to produce desired results. The various characteristics mentioned above, as well as other features and characteristics described in more detail below, will be readily apparent to those skilled in the art upon reading the following detailed description of the various embodiments, and by referring to the accompanying drawings. In the drawings and specification, there have been disclosed embodiments of the invention and, although specific terms are employed, they are used in a generic and descriptive sense only and not for the purpose of limitation, the scope of the invention being set forth in the following claims. For example, those skilled in the art may recognize that certain steps can be combined into a single step. Furthermore, language referring to order, such as first and second, should be understood in an exemplary sense and not in a limiting sense. In the drawings and description, like parts are marked throughout the specification and drawings with the same reference numerals, respectively. The prime notation, if used, indicates similar elements in alternative embodiments. The drawings are not necessarily to scale. Certain features of the disclosure may be shown exaggerated in scale or in somewhat schematic form and some details of conventional elements may not be shown in the interest of clarity and conciseness.

As used herein, the terms "comprising," "containing," "including," and "such as" are used in their open, non-limiting sense.

A fluid as used herein refers to any liquid or gas moving through a wellbore of an injection well. Embodiments of the present invention can be used in wellbores that utilize water, brine, other aqueous solution, organic solutions, organic mixtures, steam, carbon dioxide, or other appropriate fluids.

An obstruction as used herein refers to any restriction in the flow path of the fluid through a wellbore of an injection well. An obstruction can be in the openhole section of the wellbore. Obstructions can form in the tubing or casing in tubing-less completions. One common way for obstructions to occur in wellbores of injection wells is by the deposition of particulate material or by particles transported from a loose structure. Obstructions also result from scale deposits that form due to incompatibilities between the injection and formation water. Obstructions can also result from mechanical downhole fish issues such as those resulting from items left in a wellbore, including, but not limited to, pieces of various drilling, logging or production equipment. For example, downhole mechanical fish issues arise when wireline or coiled tubing bottom hole assemblies are lost in the wellbore during a well intervention operation. Deformations in the tubing or casing of the wellbore can also cause obstructions. For example, tubing collapse caused by tensile and collapse loads can result in obstructions in the wellbore.

Obstructions cause changes in the one or more characteristics of fluid flow in a wellbore of an injection well. For example, obstructions can cause increased injection pressure of injection wells. Obstructions can also cause decreased injection volume of fluid through the wellbore of injection wells. The presence of a downhole obstruction can result in additional pressure drop, further increasing the injection pressure with a drop in the injection rate.

The concept of skin is used to characterize the changes in the pressure behavior associated with the injection wells. Skin is the pressure drop due to non-ideal conditions. These pressure changes can be caused by changes in the wellbore or in the reservoir or in both. For example, certain skin is attributed to damage or stimulation associated with the injection wells. Positive skin, where the pressure is higher than it should be, usually represents damage; while negative skin, where the pressure is lower than it should be, usually represents stimulation. Mechanical skin is the reduction in permeability in the near-wellbore area resulting from mechanical factors. Such mechanical factors include, for example, without limitation, the displacement of debris that plugs the perforations or formation matrix. Formation damage skin refers to the decrease in permeability that can occur in the near wellbore region of a reservoir. This usually represents a positive skin effect. The formation near the wellbore can also be damaged by physical crushing or compaction of the rock. Laminar skin for horizontal wells is expressed as the sum of perforation geometry skin, formation damage skin and crushed zone skin surrounding the perforation. Achieving effective acid stimulation requires the distribution of treatment fluids along the entire reservoir length. Several previous studies have demonstrated the effect and significance of the mechanical skin as compared to the formation damage skin. Removal of obstruction is as important as improving the formation damage skin to recover water injection rate.

Exemplary embodiments of the invention include a method of detecting a presence of at least one obstruction in a wellbore of an injection well and determining dimensions of that obstruction. The method includes measuring characteristics of fluid flow in a wellbore of an injection well, characteristics of a reservoir associated to the injection well, and characteristics of the wellbore of the injection well. Actual and simulated measurements of characteristics of fluid flow in a wellbore of an injection well, characteristics of a reservoir associated to the injection well, and characteristics of the wellbore of the injection well, can be stored on computer readable medium, can be part of a database, which may optionally be accessible via a communications network. According to various exemplary embodiments of the present invention, such a database can be any database structure as is known and understood by those skilled in the art. The databases discussed herein can be, for example, any sort of organized collection of data in digital form. Databases can include the database structure as well as the computer programs that provide database services to other computer programs or computers, as defined by the client-server model, and any computer dedicated to running such computer programs (i.e., a database server). An exemplary database model, for example, is Microsoft SQL Server 2008 R2. Databases can include a database management system (DBMS) consisting of software that operates the database, provides storage, access, security, backup and other facilities. Databases can implement any known database model or database models, including, for example, a relational model, a hierarchical model, a network model, or an object-oriented model. It will be appreciated by those having skill in the art that data described herein as being stored in the databases can also be stored or maintained in non-transitory memory and accessed among subroutines, functions, modules, objects, program products, or processes for example, according to objects and/or variables of such subroutines, functions, modules, objects, program products or processes. Any of the fields of the records, tables, libraries, and so on of the database can be multi-dimensional structures resembling an array or matrix and can include values or references to other fields, records, tables, or libraries. Any of the foregoing fields can contain either actual values or a link, a join, a reference, or a pointer to other local or remote sources for such values.

The characteristics of fluid flow in a wellbore used in analyzing well performance include one or more of the following: surface injection pressure, bottomhole injection pressure, fluid velocity, fluid flow rate, fluid temperature, fluid density, fluid viscosity, friction factors, and combinations thereof. These characteristics of fluid flow in a wellbore can be measured by a variety of measurement devices, including, but not limited to, flow sensors, pressure gauges, and temperature sensors. Measurements can be transmitted to the surface or recorded in downhole memory devices.

The characteristics of a reservoir associated to the injection well used in analyzing well performance include one or more of the following: reservoir pressure, resistivity, permeability, porosity, formation thickness, rock properties, reservoir structure, reservoir geometry, formation skin damage, and combinations thereof. These characteristics of a reservoir are measured by a variety of measurement devices, including, but not limited to, flow sensors, pressure gauges, temperature sensors, and devices that measure the electric, acoustic, radioactive and electromagnetic properties of the reservoir. A variety of logging techniques can be used. Measurements can be transmitted to the surface or recorded in downhole memory devices.

The characteristics of the wellbore of the injection well used in analyzing well performance include one or more of the following: wellbore radius, wellbore length, wellbore structure, mechanical properties, wellbore geometry, and combinations thereof. For example, certain well performance models use inner diameters and lengths of the tubing or casing sections of the wellbore. These characteristics of the wellbore are measured by a variety of measurement devices, including, but not limited to, flow sensors, pressure gauges, and temperature sensors. Measurements can be transmitted to the surface or recorded in downhole memory devices.

A flow sensor as used herein is a device for sensing the rate of flow, and can be a part of flowmeters and flow loggers. A flowmeter is a device for measuring the rate of flow of fluid, and for example, without limitations, include solar flowmeters, ultrasonic flowmeters, and magnetic flowmeters. Flow measuring devices can be affixed at specific locations in the wellbore or can be lowered and raised in the wellbore containing one or more flowing fluids whose velocity or flow rate are to be determined.

In certain embodiments, the method of detecting a presence of an obstruction in a wellbore of a fluid injection well and determining dimensions of that obstruction includes creating one or more well performance models—(1) a well performance model based on actual measurements of one or more characteristics of fluid flow in a wellbore of an injection well, actual measurements of one or more characteristics of a reservoir associated to the injection well, and actual measurements of one or more characteristics of the wellbore of the injection well, and (2) a simulated obstruction performance model based on both the actual measurements of one or more characteristics of fluid flow in a wellbore of an injection well, measurements of one or more characteristics of a reservoir associated to the injection well, and measurements of one or more characteristics of the wellbore of the injection well, and the simulated fluid flow computations across a simulated mechanical obstruction in the wellbore. Another well performance model that can be used includes a well performance model based on ideal or substantially ideal measurements of one or more characteristics of fluid flow in a wellbore of an injection well, ideal or substantially ideal measurements of one or more characteristics of a reservoir associated to the injection well, and ideal or substantially ideal measurements of one or more characteristics of the wellbore of the injection well.

Well performance modeling of single phase flow water injection wells, is deemed reliable and predictive due to the unique match it demonstrates compared to the actual injection history. For water injection wells, where no gas is present and incompressible flow is assumed, the uncertainty in frictional and turbulent flow pressure losses is usually minimal. Calculation of the bottomhole injection pressure based on the surface pressure and the fluid flow rate is usually very accurate and dependent on the quality of the data measured on the surface flowmeters. Solar flowmeters, for example, are utilized to record the flow rate and surface injection pressure continuously to monitor the well injection performance. Solar flowmeters operate on recording the pressure drop across an orifice plate installed in the flow line upstream of the wellhead. The water flow rate is then calculated using similar fluid mechanics equations as used to estimate differential pressure across surface chokes. Both the outflow and the inflow performance relationships are determined using this available real-time data and converting surface injection pressure to the respective downhole pressure. Then the pressure is plotted against the flow rate to get an updated well performance models. By means of such models, injectivity index, reservoir pressure and even total skin can be easily estimated. In certain embodiments, one reliable fall-off test is sufficient to calibrate the well performance model and estimate permeability and thickness inputs in horizontal inflow performance correlations. An injector fall-off test involves the measurement and analysis of pressure data taken after an injection well is shut in. Wellhead pressure rises during injection, and if the well remains full of liquid after shut-in of an injector, the pressure can be measured at the surface, and bottomhole pressures can be calculated by adding the pressure from the hydrostatic column to the wellhead pressure. In one embodiment, solar flowmeter data (SFM) was analyzed along with well test results to evaluate the well performance before and after acid stimulation to take account the contributions of both mechanical skin and damage skin improvement.

Certain embodiments of the invention are used for the evaluation and quantification of wellbore obstructions effect on the well performance of water injection wells. In certain embodiments of the invention, data regarding the well performance is analyzed to develop cost-effective well performance diagnoses prior to taking any costly actions to remedy the well conditions such as major acid stimulation treatments. Certain exemplary methods of the invention are used to estimate downhole obstructions restriction sizes such as scale using the surface injection data.

Exemplary embodiments of the invention include a computer-implemented method to determine dimensions of one or more actual obstructions identified as being in a wellbore of an injection well. The method includes (a) obtaining a plurality of measurements of one or more characteristics of fluid flow in a wellbore of an injection well, a plurality of measurements of one or more characteristics of a reservoir associated with the injection well, and a plurality of measurements of one or more characteristics associated with the wellbore of the injection well; (b) creating one or more correlations based on a first estimated injectivity index to simulate fluid flow across one or more simulated mechanical obstructions to thereby define a simulated obstruction performance model, the one or more correlations being responsive to the plurality of measurements of one or more characteristics of fluid flow in the wellbore of the injection well, the plurality of measurements of one or more characteristics of the reservoir associated with the injection well, the plurality of measurements of one or more characteristics associated with the wellbore of the injection well, and a plurality of simulated fluid flow measurements across the at least one simulated mechanical obstruction in the wellbore; (c) determining a second estimated injectivity index, responsive to the simulated obstruction performance model, the plurality of measurements of one or more characteristics of actual fluid flow in the wellbore of the injection well, the plurality of measurements of one or more characteristics of the reservoir associated with the injection well, and the plurality of measurements of one or more characteristics associated with the wellbore of the injection well; (d) performing iteratively steps (a) to (c) until the first estimated injectivity index value and the second estimated injectivity index value converge within preselected tolerance limits; and (e) determining dimensions of the one or more actual obstruction in the wellbore responsive to the simulated obstruction performance model and the plurality of measurements of one or more characteristics associated with the wellbore of the injection well when the first estimated injectivity index and the second estimated injectivity index converge within acceptable tolerance limits.

In certain embodiments of the invention, the simulated obstruction performance model includes at least one of the following: an outflow performance relationship analysis and an inflow performance relationship analysis. The outflow performance relationship analysis is responsive to the plurality of measurements of one or more characteristics of fluid flow in the wellbore of the injection well. The inflow performance relationship analysis is responsive to the plurality of measurements of one or more characteristics of fluid flow in the wellbore of the injection well and the plurality of measurements of one or more characteristics of the reservoir associated with the injection well.

In certain embodiments, the well performance model is based on an inflow performance relationship (IPR) and outflow performance relationship (OPR) analysis to estimate downhole obstruction size in power water injectors. Solar flowmeter data recorded at the surface was used to validate and calibrate out-flow and in-flow performance models taking advantage of the single-phase flow behavior. The OPR analysis was constructed by considering gravitational and frictional pressure changes to convert the injection pressure to bottomhole flowing pressure.

The IPR for a well is the relationship between the fluid injection rate and the pressure differential between the bottomhole injection pressure and the reservoir pressure. In certain embodiments of this invention, two inflow models were built and calibrated—a constant injectivity index model and a Joshi model—to take in account the other reservoir attributes such as permeability, anisotropy and skin factor. The IPR models were constructed based on the valid assumption that the reservoir performance in water injection wells is exactly the same as oil reservoirs that are above the bubble point. Some of the factors affecting IPR include pressure inside the reservoir, nature of reservoir fluids, and types of rocks. A straight line IPR is expected if one assumes an equivalent injectivity index across the horizontal section. The Joshi correlation and constant injectivity index models were used to predict the horizontal inflow performance relationship and to account for skin, formation thickness and anisotropy effects. Rock properties data such reservoir permeability (K) and reservoir thickness (h) were estimated from well test and offset wells core analysis, and then calibrated later using the solar flowmeter data. Reservoir pressure values were collected from the pressure surveys performed on the well.

Below is the constant injectivity index equation for water injection wells;

$$q = II \times (P_{wf} - P_R)$$

Where,
  $q$=injection rate, bbl/day
  $II$=Injectivity Index, bbl/day/psi
  $P_{wf}$=bottomhole injection pressure, psi
  $P_R$=Reservoir pressure, psi Outflow Performance Relationship (OPR) includes measurements of fluid flow and the pressure difference across each segment of the fluid flow. Calculating the pressure drop at each segment is serious problem as it involves the simultaneous flow of oil, gas and water (multiphase flow), and the pressure drop is dependent on many interrelated variables. Outflow performance curves are constructed for a specific well by calculating the $P_{wf}$ at different injection rates and surface pressure values. Pressure changes due to gravity, friction, casing size change and turbulence were included in the model. Each casing string has its own turbulence and frictional losses. The incompressible fluid properties of water are assumed to be independent of pressure and temperature changes. In an exemplary model, pipe roughness to diameter ratio is assumed to be 0.0006.

Below, is the flow equation addressing the pressure gradient in the tubulars:

$$\frac{dP}{dL} = \frac{\rho_w \sin\phi}{144} + \frac{f \rho_w v_m^2}{24\, g_c d}$$

Where, $$\frac{dP}{dL} = \text{pressure drop gradient, psi/ft}$$

$g_c$=gravity component, 32.2 ft/s²
$\rho_w$=Water density, lbm/ft³
$v_m$=fluid velocity, ft/s
f=friction factor, unitles
d=Pipe inside diameter, inch
Ø=Wellbore deviation angle.

The IPR and OPR models were coupled to determine the expected flow conditions of the well at different injection pressure values.

FIG. 1 is an illustration of an exemplary embodiment of the methods of the invention. In one embodiment, the method includes estimating one or more physical dimensions of one or more actual obstructions identified as being in a wellbore of an injection well. The method includes estimating 101 one or more locations within the wellbore and one or more physical dimensions of one or more actual obstructions to thereby define a simulated obstruction within the wellbore. Locations can be determined by well intervention. A wireline tool can be lowered in the wellbore to find the obstruction depth. The method further includes obtaining 102 two or more sets of actual measurements of two or more characteristics of fluid flow in the wellbore including two or more actual injection rates and two or more actual injection pressures. In certain embodiments, those data sets are obtained when there is a confirmed obstruction. The method further includes calculating 103 a plurality of actual upstream pressure values of the simulated obstruction, the upstream pressure values being responsive to a first outflow performance relationship and a first set of actual measurements of two or more characteristics of fluid flow in the wellbore, the first set of measurements including a first set of actual fluid injection rates and a first set of actual injection pressures. The method further includes calculating 104 a plurality of corresponding downstream pressure values across the simulated obstruction, the corresponding downstream pressure values being responsive to a first estimated injectivity index value, one or more actual measurements of one or more characteristics of the reservoir associated with the injection well, and the first set of actual measurements of two or more characteristics of fluid flow in the wellbore. In certain embodiments, the first estimated injectivity index values are based on previously measured injectivity index values. The method further includes determining one or more functions to associate a plurality of pressure differentials between the upstream pressure values and the corresponding downstream pressure values 105 with the first set of actual fluid injection rates responsive to a function of estimated downhole choke behavior for the wellbore to thereby model the fluid flow across the simulated obstruction to thereby define the simulated obstruction model 106. The method further includes determining 107 a second outflow performance relationship for the fluid flow through the wellbore responsive to the simulated obstruction model to thereby model well performance with the simulated obstruction and determining 108 a second estimated injectivity index value responsive to matching a second set of actual measurements of two or more characteristics of fluid flow in the wellbore with a set of simulated fluid flow values obtained from the well performance model with the simulated obstruction, the second set of actual measurements including a second set of actual fluid injection rates and a second set of actual injection pressures. The above described steps are performed 109 iteratively until the first estimated injectivity index value and the second estimated injectivity index value converge within preselected tolerance limits. The method further includes determining 110 one or more physical dimensions of one or more actual obstructions in the wellbore responsive to the simulated obstruction model and a plurality of measurements of one or more characteristics associated with the wellbore when the first estimated injectivity index value and the second estimated injectivity index value converge within preselected tolerance limits.

In certain embodiments, the preselected tolerance limit is approximately about 5%. The preselected tolerance limit can be expressed as ±5%. In certain embodiments, the preselected tolerance limit is ±6%. In certain embodiments, the preselected tolerance limit is ±4%.

Any obstruction in wellbore is, conventionally, considered part of the OPR, so there is the need to have a reliable model relating the pressure drop across any wellbore restriction to the flow rate. The injectivity index seen by any rate test or well test of a well having an obstruction in the wellbore is a total injectivity index affected by both the formation damage, if any, and the presence of a flow restriction that consumes the flow energy of the fluids before they reach the reservoir rock.

Furthermore, the methods to estimate one or more physical dimensions of one or more actual obstructions identified as being in a wellbore of an injection well according to exemplary embodiments of the present invention, and as discussed above, can be implemented using one or more computers, one or more servers, one or more databases, and one or more communications networks. The methods of estimating one or more physical dimensions of one or more actual obstructions identified as being in a wellbore of an injection well as discussed above can be driven by a computer that can include, according to various exemplary embodiments of the present invention, at least a memory, a processor, and an input/output device. As used herein, the processor can include, for example, one or more microprocessors, microcontrollers, and other analog or digital circuit components configured to perform the functions described herein. The processor is the "brains" of the respective computer, and as such, can execute computer program product or products. For example, the processor in simulated modeling system can execute a computer program product or instructions stored in memory of the computer, including, for example, a product to facilitate the generation of well performance models. Such a product can include a set of instructions to display a user interface at a remote computer that would allow a user to access and input, if required, actual measurements of one or more characteristics of fluid flow in a wellbore of an injection well, measurements of one or more characteristics of a reservoir associated to the injection well, and measurements of one or more characteristics of the wellbore of the injection well. Such a product can also include instructions to carry out exemplary embodiments of the methods described above. The processor can be any commercially available terminal processor, or plurality of terminal processors, adapted for use in or with the computer. The processor can be, for example, the Intel® Xeon® multicore terminal processors, Intel® micro-architecture Nehalem, and AMD Opteron™ multicore terminal processors, Intel® Core® multicore processors, Intel® Core iSeries® multicore processors, and other processors with single or multiple cores as is known and understood by those skilled in the art. The processor can be operated by operating system software installed on memory, such as Windows Vista, Windows NT, Windows XP, UNIX or UNIX-like family of systems, including BSD and GNU/Linux, and Mac OS X. The processor can also be, for example the TI OMAP 3430, Arm Cortex A8, Samsung S5PC100, or Apple A4. The operating system for the processor can further be, for example, the Symbian OS, Apple iOS, Blackberry OS, Android, Microsoft Windows CE, Microsoft Phone 7, or PalmOS.

A computer can further include a non-transitory memory or more than one non-transitory memories (referred to as memory herein). Memory can be configured, for example, to store data, including computer program product or products, which include instructions for execution on the processor. Memory can include, for example, both non-volatile memory, e.g., hard disks, flash memory, optical disks, and the like, and volatile memory, e.g., SRAM, DRAM, and SDRAM as required to support embodiments of the instant invention. As one skilled in the art will appreciate, though the memory is depicted on, e.g., a motherboard, of the computer, the memory can also be a separate component or device, e.g., flash memory, connected to the computer through an input/output unit or a transceiver. As one skilled in the art will understand, the program product or products, along with one or more databases, data libraries, data tables, data fields, or other data records can be stored either in memory or in separate memory (also non-transitory), for example, associated with a storage medium such as a database (not pictured) locally accessible to the computer, positioned in communication with the computer through the I/O device.

Figure 2:
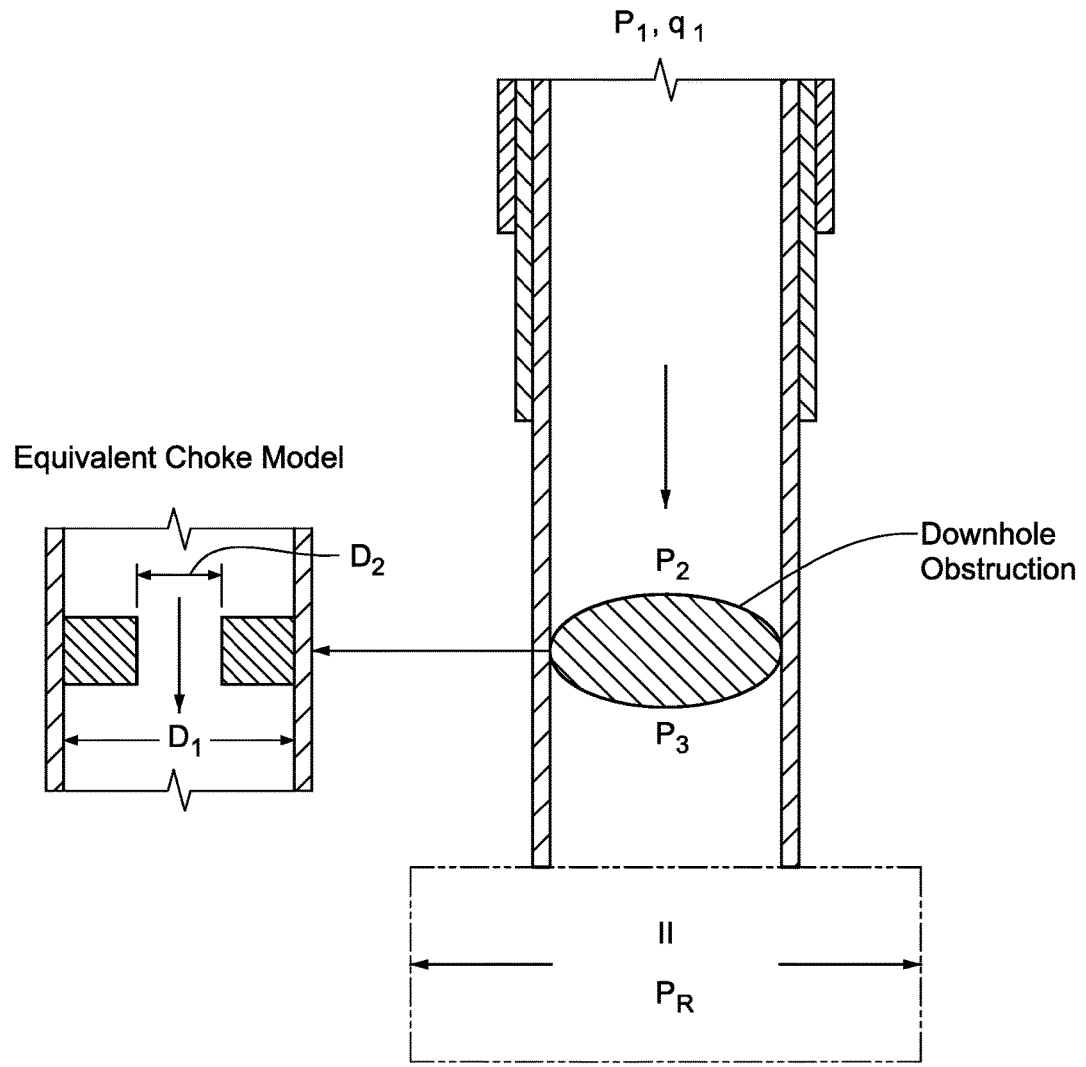
FIG. 2 is an illustration of a simulated obstruction in a wellbore of an injection well.

As illustrated by an example in FIG. 2, a simulated obstruction is modeled to be a downhole choke set at a certain opening of the wellbore, where the diameter is $D_1$, and causes a pressure drop that reduces the bottomhole injection pressure $P_{wf}$. The diameter of the simulated reservoir pressure $P_R$. This is done for a sample set of injection data to reduce uncertainty. Diameter of the simulated obstruction, or an equivalent choke, is $D_2$. The upstream pressure value of the obstruction ($p_2$) is calculated using OPR model, injection pressure ($p_1$), and injection rate ($q_1$). The downstream pressure value of the obstruction ($p_3$) is calculated using $p_2$, an estimated injectivity index II, and the reservoir pressure.

Figure 3:
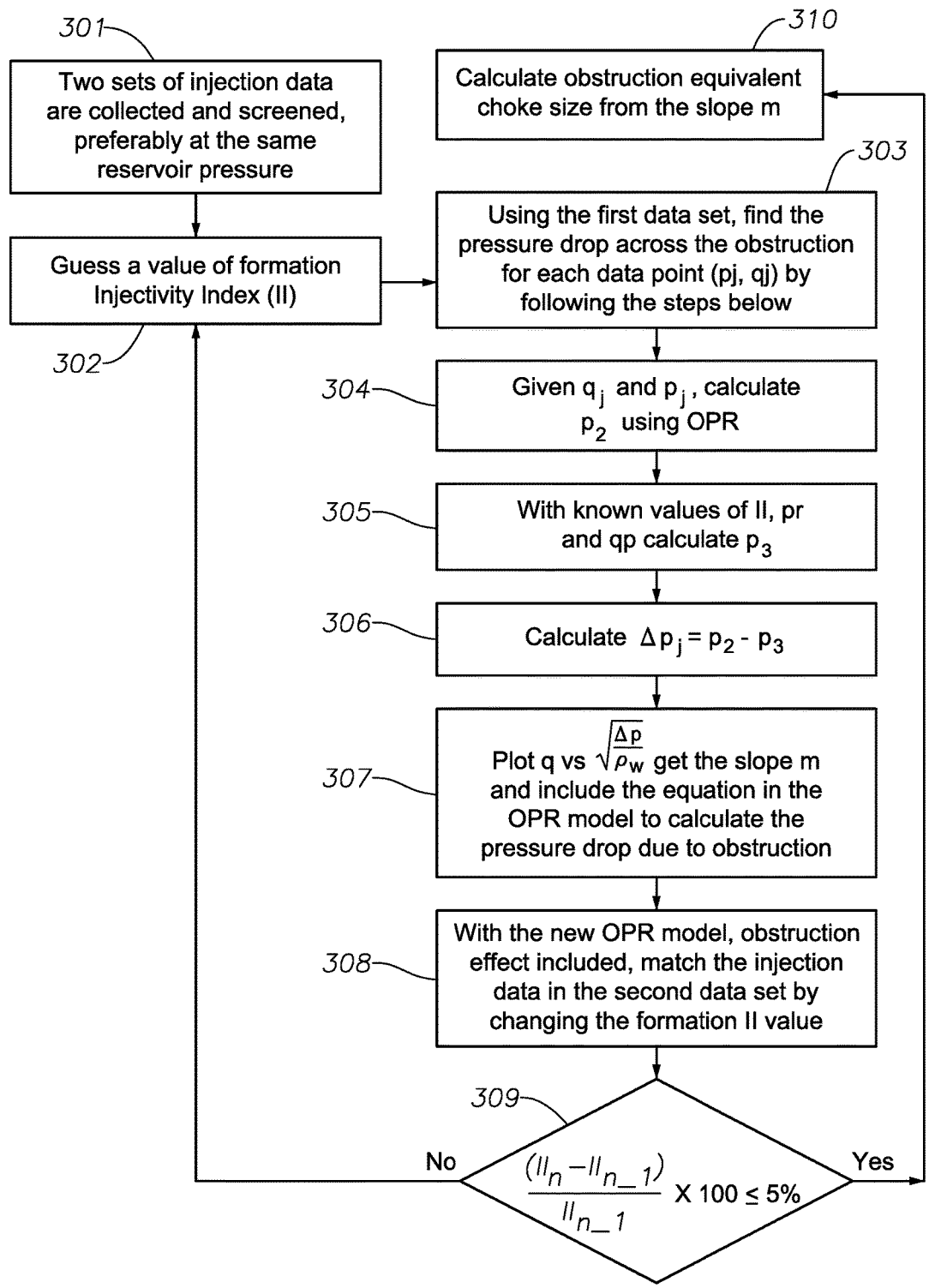
FIG. 3 is a schematic block diagram of an exemplary method to estimate one or more physical dimensions of one or more actual obstructions in a wellbore of an injection well.

FIG. 3 is an illustration of another exemplary embodiment of a method of the invention. In this embodiment, two or more sets of injection data 301 are collected and screened, preferably at the same reservoir pressure. A first formation injectivity index 302 is assumed. Using the first data set, the pressure drop across the obstruction for each data point ($p_j$, $q_j$) is calculated 303.

The upstream pressure value of the obstruction, $p_2$, is calculated 304 using a first OPR, injection pressure ($p_1$), and injection rate ($q_1$). The downstream pressure value of the obstruction ($p_3$) is calculated 305 using $p_2$, a first estimated injectivity index, and the reservoir pressure ($p_R$). The pressure drop across the obstruction 306 is the pressure difference between the upstream and downstream pressure values ($p_2$-$p_3$). The square root of a term—pressure drop/water density—is calculated 307 and plotted against different flow rate values obtained from the above injection data set. Since the mechanical obstruction will approximately behave like a downhole choke, it should follow the below equation:

$$q = \frac{22800 D_2^2}{\sqrt{1-\left(\frac{D_2}{D_1}\right)^4}} \sqrt{\frac{\Delta p}{\rho_w}}$$

Where,
q=injection rate, bbl/day
$D_1$=Tubular/openhole diameter, inch
$D_2$=Obstruction/equivalent choke diameter, inch
Δp=Pressure drop across the obstruction/equivalent choke, psi
$\rho_w$=water density, lbm/ft³

The obtained obstruction model is incorporated 308 with the OPR portion of the well performance model. Using another injection data set at, preferably, the same reservoir pressure, a second injectivity index is estimated by matching the rate value obtained from the new well performance model, with obstruction effect included, with the actual rate recorded by the solar flowmeter (SFM). Steps 302-308 are repeated 309 till the first injectivity index and the second injectivity index values converge with less than 5% tolerance. The equivalent choke diameter is then calculated 310 from the slope of the best fit line using the following equation:

$$D_2 = \left[\frac{m^2}{\left(5.198 \times 10^8 + \frac{m^2}{D_1^4}\right)}\right]^{1/4}$$

Where,
$D_1$=Tubular/openhole diameter, inch
$D_2$=Obstruction/equivalent choke diameter, inch
m=Slope of the obstruction choke model obtained from the simulated obstruction model Modeling of horizontal power water injectors using the IPR/OPR analysis shows remarkable results in terms of accuracy and reliability. The Joshi correlation demonstrates excellent injection rate matching when compared with real Solar Flow Meter data. The assumption of constant injectivity index to predict the reservoir pressure is valid in the short term where the change in injectivity index is minimal. This modeling approach with a simulated obstruction was tested to model mechanical wellbore obstructions.

EXAMPLE

The following example further illustrates the compositions and methods. A well performance modeling approach was used to investigate and explain the possible causes of an extraordinary gain in the injection rate noticed after performing a well treatment plan, an acid stimulation treatment. The well was confirmed having an obstruction in the open-hole section prior to the acid stimulation which indicated the presence of mechanical skin along with formation damage skin targeted by the matrix stimulation. The mechanical skin effect was modeled and incorporated in the out flow performance to be compared with the formation damage skin effect. The improvement in the well conditions was dominated by the mechanical skin (obstruction removal) rather than the formation skin improvement. It was concluded that an acid wash or any other means of removing the mechanical skin arising from the obstruction accumulation in the openhole should have been sufficient as far as economics are concerned.

Figure 4A:
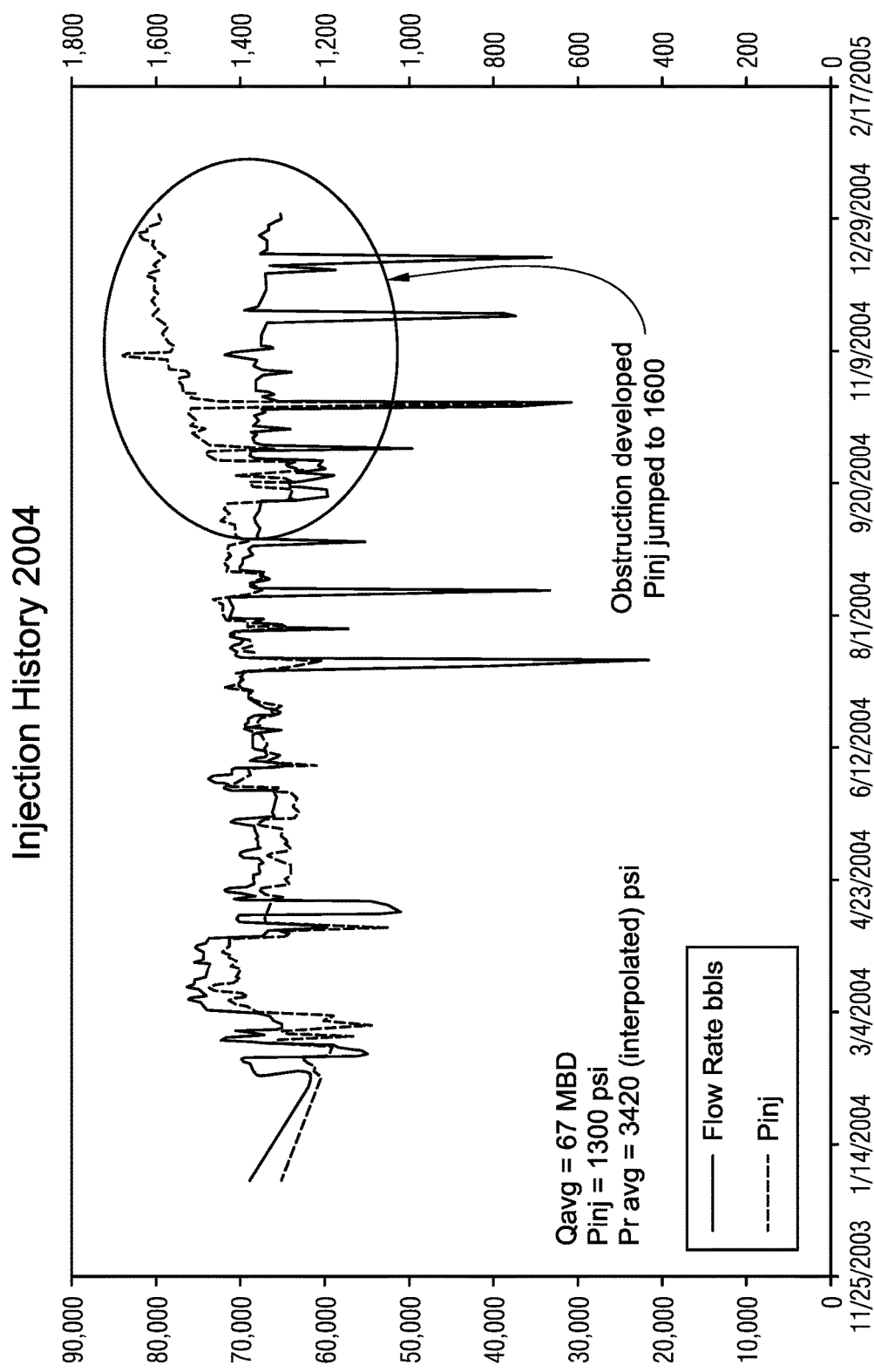
FIGS. 4a, 4b, and 4c are graphical representations of the fluid injection rate and injection pressure history of an exemplary Well A during different time periods.

A horizontal power water injection well, Well A, was drilled and completed in 2003. The initial injection rate was around 64 MBWD at 1300 psi injection pressure. In late 2009, an obstruction was detected, using calipers, during a normal production logging job 9 feet below the liner shoe. In 2012, an acid stimulation job was planned for this well. According to the last fall-off test conducted in 2008, the injectivity index and skin were found to be 59.40 bbl/day/psi and +2.2 respectively. The acid job was successfully performed using bullheading technique and the rate gain was more than 34 MBWD, from 21 to 55 MBWD, which is deemed remarkable compared to other wells in the area. The gain observed is believed to be due to the implementation of the bullheading technique with the horizontal open-hole power water injection well. However, obstruction removal from the wellbore was not taken into account to be a critical factor resulting in such high gain. The injection history of the well was reviewed and it shows indications of obstruction development in the wellbore such as a sudden increase in the wellhead surface pressure at the same injection rate (see FIGS. 4a-c). FIG. 4a shows the injection rate and injection pressure history of Well A in 2004 showing the potential obstruction development period. The average injection pressure was initially about 1300 psi and then increased to about 1600 psi. The average fluid flow rate was 67 MBWD.

Figure 4B:
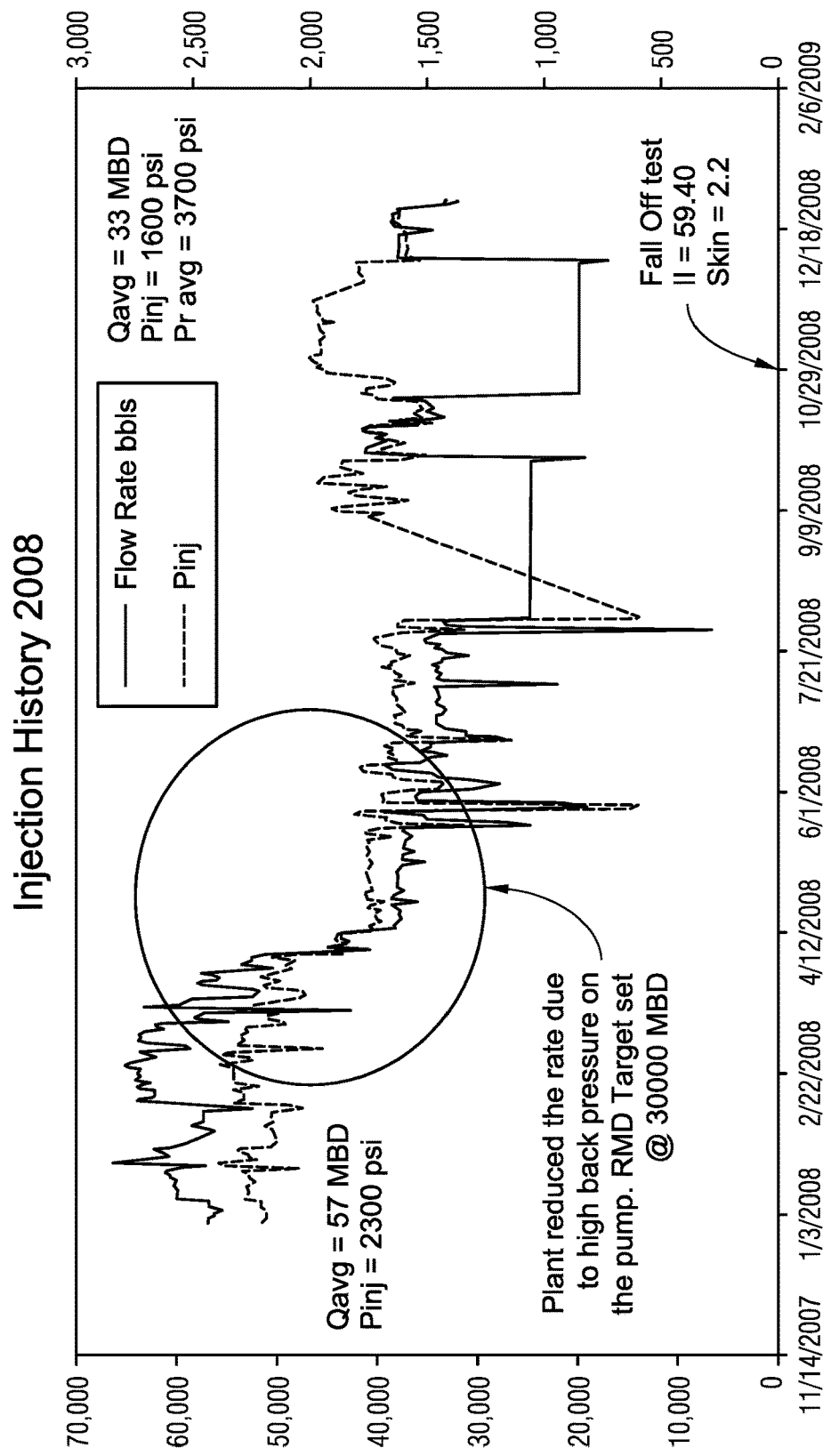
Figure 4C:
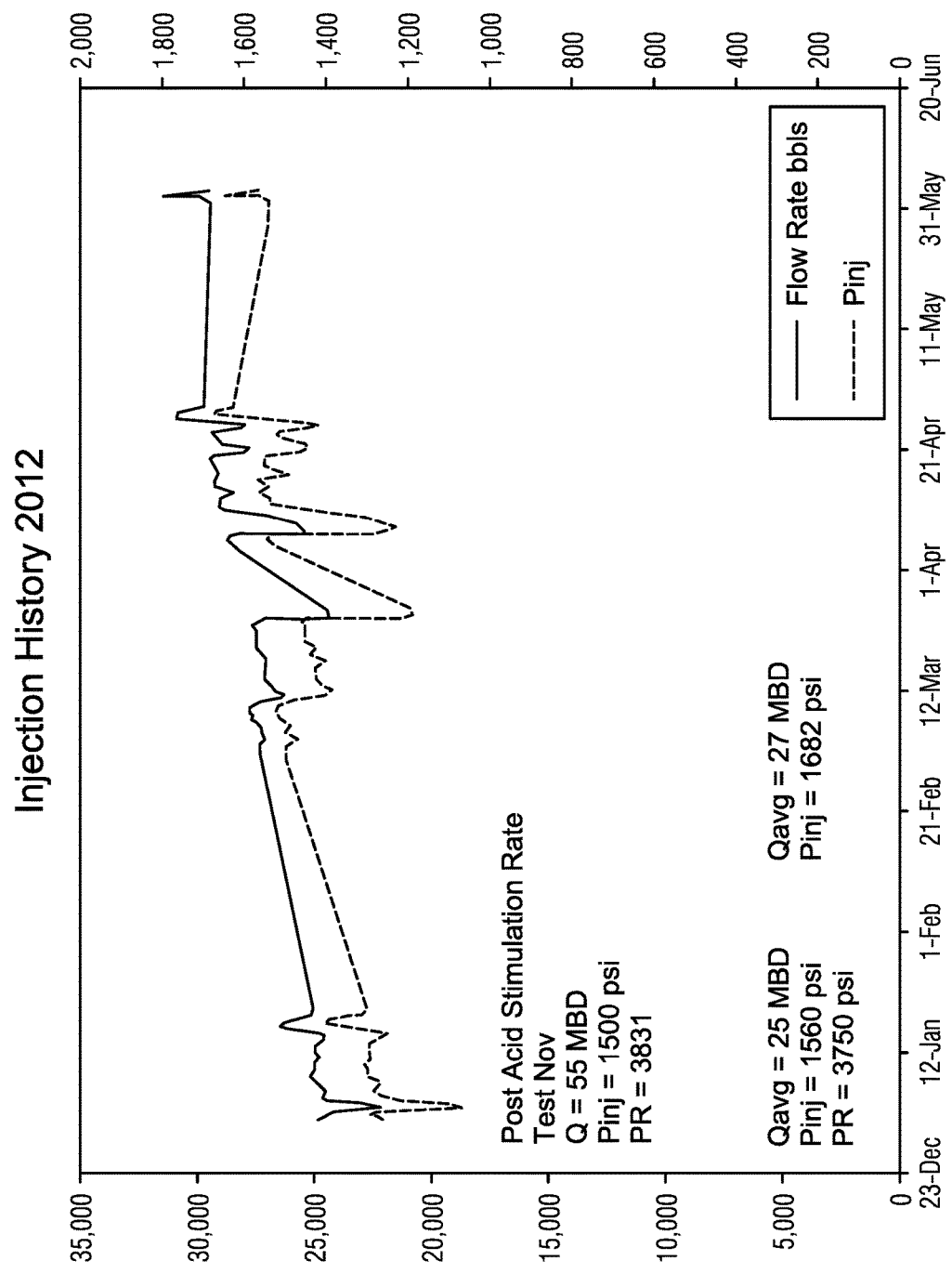

FIG. 4b shows the injection rate and injection pressure history of Well A in 2008. The average injection pressure was about 2300 psi and the average fluid flow rate was 57 MBD. A fall-off test was conducted in late 2008, and injectivity index was determined to be 59.40 bbl/day/psi. This calculated injectivity index was used in the model. FIG. 4c shows the injection rate and injection pressure history of Well A in 2012 following an acid wash treatment plan. Qavg is the average flow rate observed at a pressure of Pinj. The 55 MBD was obtained by performing a post-stimulation injectivity test to quantify the gain after the acidizing job.

Figure 5A:
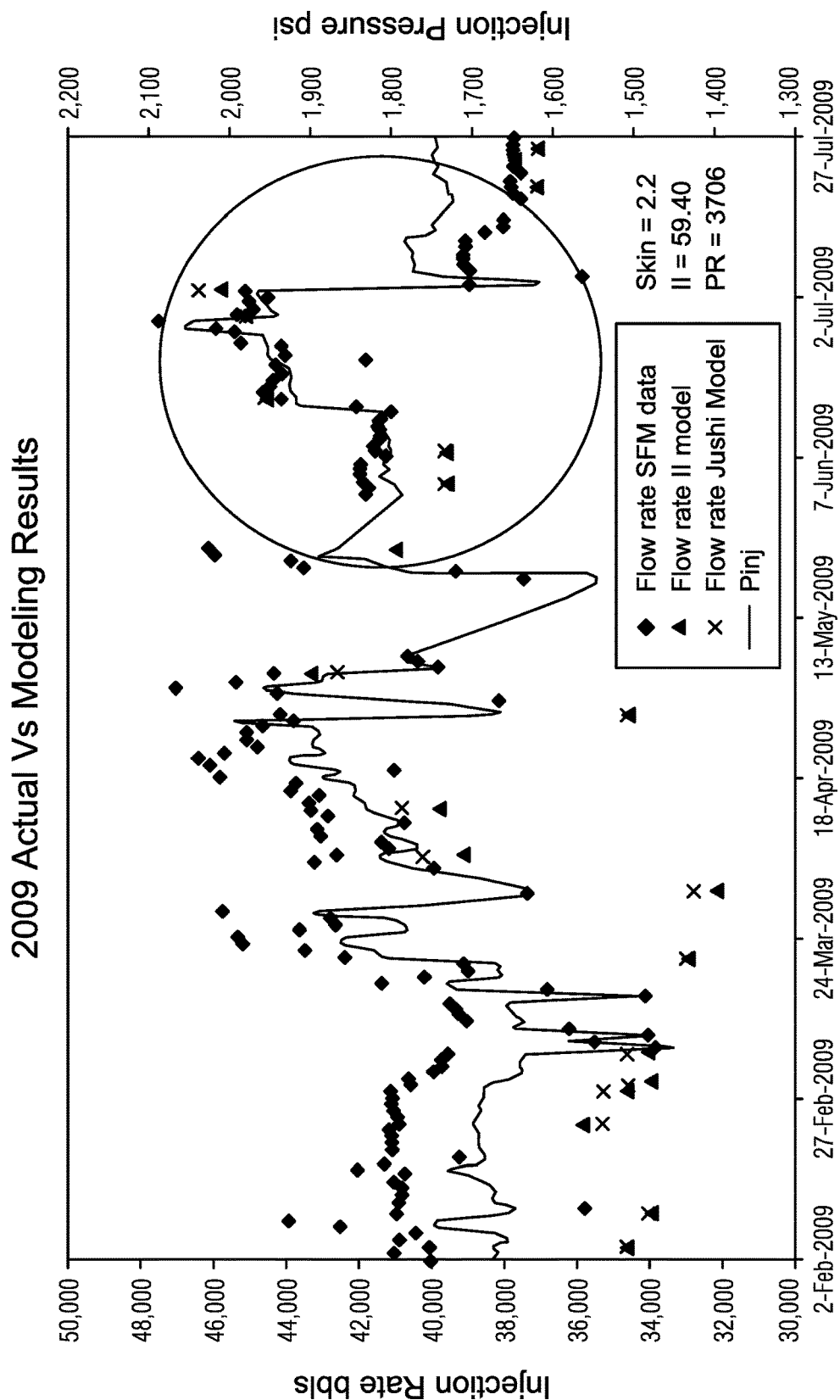
FIGS. 5a and 5b are graphical representations of the actual measurements of fluid flow rates from Well A during different time periods and data points from both the Joshi model and the injection injectivity model.
Figure 5B:
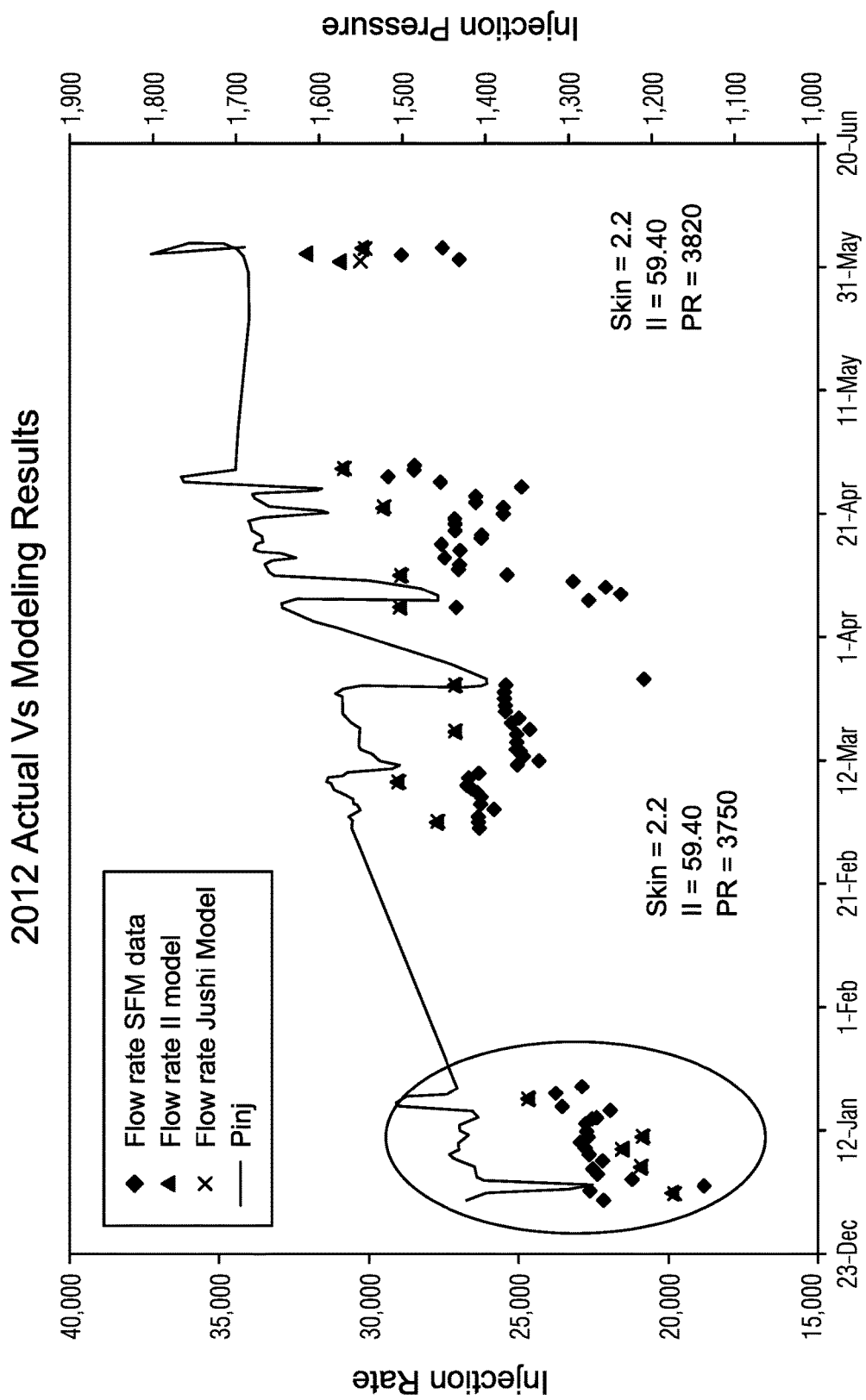

Calibration of the well performance models was done by comparing their outputs with the injection history at different reservoir pressures. Well test data available combined with rate tests were utilized to calibrate Joshi model and estimate both permeability and $K_h/K_v$ ratio of the reservoir. History matching was done at two different years using exactly the same model taking in consideration the changes in reservoir pressure and assuming time-independent injectivity index. Results are shown in FIGS. 5a and 5b. The model shows good match with the raw injection data recorded by the solar flowmeters. The model here is the one without the effect of downhole obstruction. The matched raw data were collected before the observation of obstruction in place. FIG. 5a shows the actual measurements of fluid flow rates from Well A in 2009 and data points from both the Joshi model and the injectivity index model. FIG. 5b shows the actual measurements of fluid flow rates from Well A in 2012 and data points from both the Joshi model and the injectivity index model.

Figure 6:
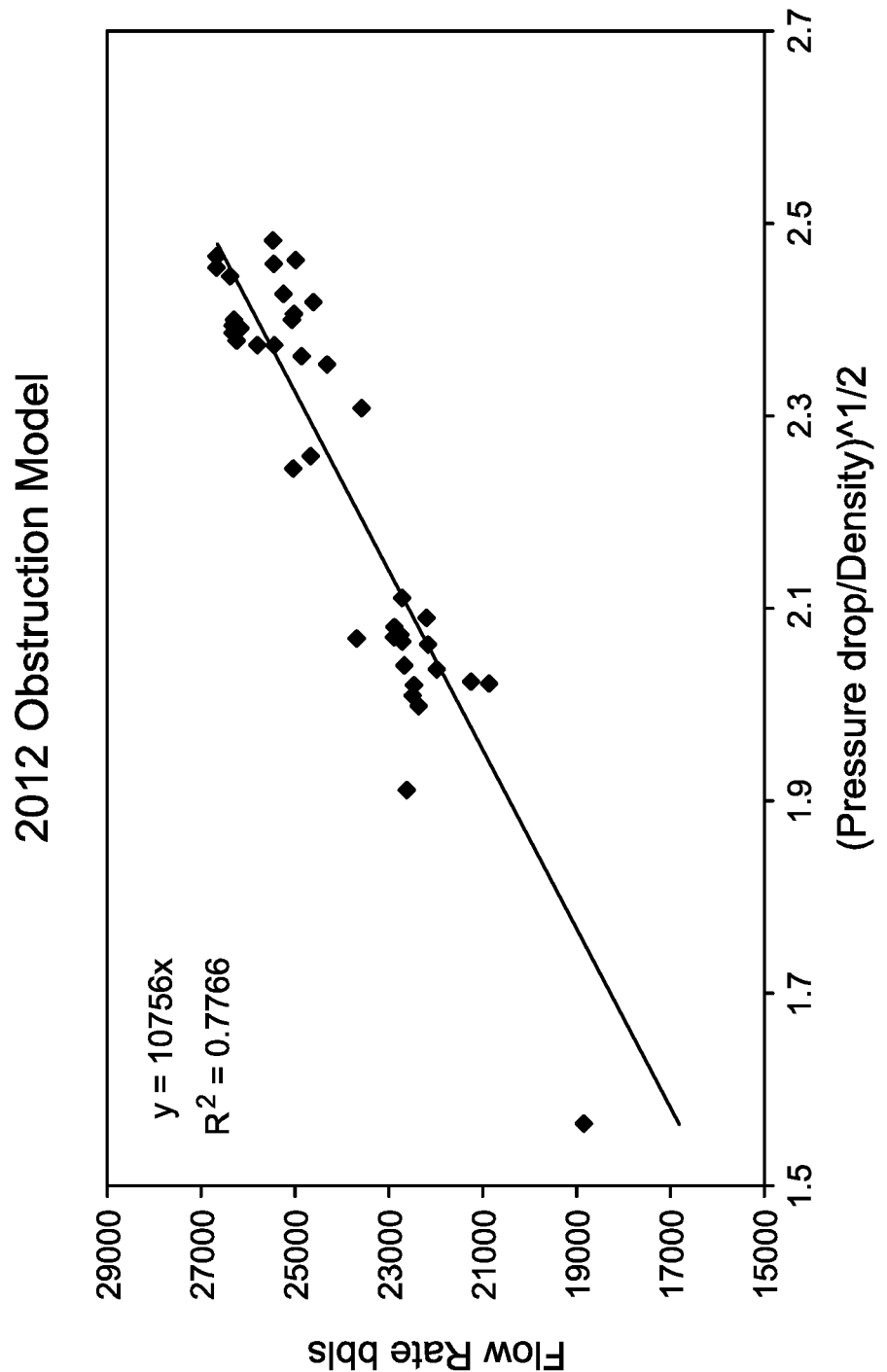
FIG. 6 is a graphical representation of the fluid flow rate and the pressure differential variables from the simulated obstruction model.

After constructing a reliable and calibrated model that takes into consideration both obstruction removal and/or formation damage improvement, different scenarios were run by the model and compared with the actual results to predict the type of skin effect being improved. A base case was established first with injection pressure equal to 1500 psi, reservoir pressure equal to 3831 psi and an injectivity index of 59.40 bbl/Day/psi. The resulting flow rate, matching with the actual data, was 21 MBWD showing the pre-acid stimulation well performance. Three scenarios were tried using the model to compare their outputs with the actual gain resulted from the acid stimulation to predict which scenario was most likely happened (see Table 1). The results show that the gain in flow rate is a product of both obstruction removal and damaged skin improvement with the former being the dominant factor. The actual gain was 34 MBWD, and it corresponds to the modeling scenario that accounts for the obstruction removal with major skin improvement. Hence, an acid wash treatment with a high rate and pumping pressure should have been enough to improve the well conditions. FIG. 6 shows a simulated obstruction model showing a linear relationship between the square root of pressure drop over density and the flow rate in BBL/Day. The obstruction diameter calculated using the well performance model with the simulated obstruction, and derived from the choke equation, using the slope of the straight line (m=10756) in FIG. 6 is 0.68" (equivalent to approximately 44/64 on the choke scale).

TABLE 1

| Scenario | Gain in Injection Rate MBWD | Injectivity Index bbl/day/psi | Skin |
| --- | --- | --- | --- |
| Obstruction removal with minor skin improvement | 22 | 200 | −1.8 |
| Obstruction removal with major skin improvement | 33 | 500 | −2.8 |
| Major skin improvement with obstruction still in place | 6 | 700 | −3 |

Moreover, the foregoing has broadly outlined certain objectives, features, and technical advantages of the present invention and a detailed description of the invention so that embodiments of the invention may be better understood in light of features and advantages of the invention as described herein, which form the subject of certain claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages is better understood from the following description when considered in connection with the accompanying figures. It is to be expressly understood, however, that such description and figures are provided for the purpose of illustration and description only and are not intended as a definition of the limits of the present invention. It will be apparent to those skilled in the art that various modifications and changes can be made within the spirit and scope of the invention as described in the foregoing specification.

The invention claimed is:

1. A method to estimate one or more physical dimensions of one or more actual obstructions in a wellbore of an injection well, the method comprising:
    (a) estimating one or more locations within the wellbore and one or more physical dimensions of one or more actual obstructions to thereby define an obstruction;
    (b) obtaining two or more sets of actual measurements of two or more characteristics of fluid flow in the wellbore including two or more actual injection rates and two or more actual injection pressures;
    (c) calculating a plurality of upstream pressure values of the obstruction;
    (d) calculating a plurality of corresponding downstream pressure values across the obstruction responsive to a first estimated injectivity index value;
    (e) determining a plurality of pressure differentials between the upstream pressure values and the corresponding downstream pressure values with a first set of actual fluid injection rates responsive to one or more estimated downhole choke behaviors for the wellbore to thereby model fluid flow across the obstruction to thereby define a simulated obstruction model;
    (f) determining a first outflow performance relationship for the fluid flow through the wellbore responsive to the simulated obstruction model to thereby model well performance with the obstruction;
    (g) determining a second estimated injectivity index value responsive to matching a first set of actual measurements of two or more characteristics of fluid flow in the wellbore with a set of simulated fluid flow values obtained from the model well performance with the obstruction;
    (h) performing iteratively steps (b) to (g) until the first estimated injectivity index value and the second estimated injectivity index value converge within preselected tolerance limits;
    (i) determining one or more physical dimensions of the obstruction in the wellbore responsive to the simulated obstruction model and a plurality of measurements of one or more characteristics associated with the wellbore responsive to the first estimated injectivity index value and the second estimated injectivity index value converge within preselected tolerance limits; and
    (j) determining one or more changes to well conditions responsive to determining the one or more physical dimensions of the obstruction in the wellbore.

2. A method as defined in claim 1, wherein the two or more sets of measurements of two or more characteristics of fluid flow in the wellbore including two or more injection rates and two or more injection pressures are obtained at substantially similar values of reservoir pressure associated with the injection well.

3. A method as defined in claim 2, wherein the two or more sets of measurements of two or more characteristics of fluid flow in the wellbore are obtained using a solar flowmeter.

4. A method as defined in claim 1, wherein the plurality of measurements of one or more characteristics associated with the wellbore includes a diameter of the wellborn.

5. A method as defined in claim 1, wherein the first estimated injectivity index values are based on previously measured injectivity index values.

6. A method as defined in claim 1, wherein the injection well is a power water injection well.

7. A system to estimate one or more physical dimensions of one or more actual obstructions in a wellbore of an injection well, the system comprising:
    one or more processors;
    one or more input and output units in communication with the one or more processors and positioned to receive a user selection of a wellbore of an injection well;
    non-transitory computer-readable medium positioned in communication with the one or more processors and having computer program stored thereon including a set of instructions that when executed by one or more processors cause the one or more processors to perform operations of:
    (a) estimating one or more locations within the wellbore and one or more physical dimensions of one or more actual obstructions to thereby define an obstruction;
    (b) obtaining two or more sets of actual measurements of two or more characteristics of fluid flow in the wellbore including two or more actual injection rates and two or more actual injection pressures;
    (c) calculating a plurality of upstream pressure values of the obstruction;
    (d) calculating a plurality of corresponding downstream pressure values across the obstruction responsive to a first estimated injectivity index value;
    (e) determining a plurality of pressure differentials between the upstream pressure values and the corresponding downstream pressure values with a first set of actual fluid injection rates responsive to one or more estimated downhole choke behaviors for the wellbore to thereby model fluid flow across the obstruction to thereby define a simulated obstruction model;
    (f) determining a first outflow performance relationship for the fluid flow through the wellbore responsive to the simulated obstruction model to thereby model well performance with the obstruction;
    (g) determining a second estimated injectivity index value responsive to matching a first set of actual measurements of two or more characteristics of fluid flow in the wellbore with a set of simulated fluid flow values obtained from the model well performance with the obstruction;
    (h) performing iteratively steps (b) to (g) until the first estimated injectivity index value and the second estimated injectivity index value converge within preselected tolerance limits;
    (i) determining one or more physical dimensions of the obstruction in the wellbore responsive to the simulated obstruction model and a plurality of measurements of one or more characteristics associated with the wellbore responsive to the first estimated injectivity index value and the second estimated injectivity index value converge within preselected tolerance limits; and
    (j) determining one or more changes to well conditions responsive to determining the one or more physical dimensions of the obstruction in the wellbore.

8. A system as defined in claim 7, wherein the system further comprises:
    one or more databases in communication with the one or more processors, the one or more databases including a plurality of actual measurements of one or more characteristics of fluid flow in the wellbore of an injection well, a plurality of actual measurements of one or more characteristics of a reservoir associated to the injection well, and a plurality of actual measurements of one or more characteristics of the wellbore of the injection well.

9. A system as defined in claim 7, wherein the two or more sets of measurements of two or more characteristics of fluid flow in the wellbore including two or more injection rates and two or more injection pressures are obtained at substantially similar values of reservoir pressure associated with the injection well.

10. A system as defined in claim 7, wherein the one or more physical dimensions of the wellbore includes a diameter of the wellbore.

11. A system as defined in claim 7, wherein the injection well is a power water injection well.

12. A computer-implemented method to determine dimensions of one or more actual obstructions identified as being in a wellbore of an injection well, the method comprising:
(a) obtaining a plurality of measurements of one or more characteristics of fluid flow in a wellbore of an injection well, a plurality of measurements of one or more characteristics of a reservoir associated with the injection well, and a plurality of measurements of one or more characteristics associated with the wellbore of the injection well;
(b) creating one or more correlations based on a first estimated injectivity index to simulate fluid flow across one or more simulated mechanical obstructions to thereby define a simulated obstruction performance model, the one or more correlations being responsive to the plurality of measurements of one or more characteristics of fluid flow in the wellbore of the injection well, the plurality of measurements of one or more characteristics of the reservoir associated with the injection well, the plurality of measurements of one or more characteristics associated with the wellbore of the injection well, and a plurality of simulated fluid flow measurements across the at least one simulated mechanical obstruction in the wellbore;
(c) determining a second estimated injectivity index, responsive to the simulated obstruction performance model, the plurality of measurements of one or more characteristics of actual fluid flow in the wellbore of the injection well, the plurality of measurements of one or more characteristics of the reservoir associated with the injection well, and the plurality of measurements of one or more characteristics associated with the wellbore of the injection well;
(d) performing iteratively steps (a) to (c) until the first estimated injectivity index value and the second estimated injectivity index value converge within preselected tolerance limits;
(e) determining dimensions of the one or more actual obstruction in the wellbore responsive to the simulated obstruction performance model and the plurality of measurements of one or more characteristics associated with the wellbore of the injection well when the first estimated injectivity index and the second estimated injectivity index converge within acceptable tolerance limits; and
(f) determining one or more changes to well conditions responsive to determining one or more physical dimensions of the one or more actual obstructions in the wellbore.

13. A method as defined in claim 12, wherein the simulated obstruction performance model includes at least one of the following: an outflow performance relationship analysis and an inflow performance relationship analysis.

14. A method as defined in claim 13, wherein the outflow performance relationship analysis is responsive to the plurality of measurements of one or more characteristics of fluid flow in the wellbore of the injection well.

15. A method as defined in claim 13, wherein the inflow performance relationship analysis is responsive to the plurality of measurements of one or more characteristics of fluid flow in the wellbore of the injection well and the plurality of measurements of one or more characteristics of the reservoir associated with the injection well.

16. A method as defined in claim 12, wherein the one or more characteristics of fluid flow in the wellbore includes one of the following: injection rate and injection pressure.

17. A method as defined in claim 12, wherein the plurality of measurements of the one or more characteristics of fluid flow in the wellbore are obtained using a solar flowmeter.

18. A method as defined in claim 12, wherein the first estimated injectivity index values are based on previously measured injectivity index values.

19. A method as defined in claim 12, wherein the one or more physical dimensions of the wellbore includes a diameter of the wellbore.

20. A method as defined in claim 12, wherein the injection well is a power water injection well.

* * * * *